US006783599B2

(12) United States Patent
Gale et al.

(10) Patent No.: US 6,783,599 B2
(45) Date of Patent: Aug. 31, 2004

(54) METHOD OF CLEANING CONTAMINANTS FROM THE SURFACE OF A SUBSTRATE

(75) Inventors: Glenn W. Gale, Austin, TX (US); Frederick W. Kern, Jr., Colchester, VT (US); William Alfred Syverson, Colchester, VT (US)

(73) Assignee: International Business Machines Corporation, Armonk, NY (US)

(*) Notice: Subject to any disclaimer, the term of this patent is extended or adjusted under 35 U.S.C. 154(b) by 196 days.

(21) Appl. No.: 09/909,277

(22) Filed: Jul. 19, 2001

(65) Prior Publication Data

US 2003/0015217 A1 Jan. 23, 2003

(51) Int. Cl.$^7$ ................................................. B08B 7/02
(52) U.S. Cl. ..................... 134/1; 134/2; 134/4; 134/17; 134/18; 134/38; 134/40; 134/1.3; 216/48; 216/52; 15/250
(58) Field of Search ............................. 134/1, 1.3, 4, 2, 134/17, 18, 38, 40; 216/48, 52; 15/250

(56) References Cited

U.S. PATENT DOCUMENTS

| 4,491,484 A | | 1/1985 | Williams ........................ 134/4 |
| 5,451,295 A | | 9/1995 | Kroll ............................ 216/52 |
| 5,724,186 A | * | 3/1998 | Collier ......................... 359/507 |
| 5,857,474 A | * | 1/1999 | Sakai et al. .............. 134/102.3 |
| 6,036,785 A | | 3/2000 | Ferrell ............................. 134/1 |

FOREIGN PATENT DOCUMENTS

JP            63-155729       6/1988

\* cited by examiner

*Primary Examiner*—Randy Gulakowski
*Assistant Examiner*—Gentle E. Winter
(74) *Attorney, Agent, or Firm*—Connolly Bove Lodge & Hutz LLP; William D. Sabo

(57) ABSTRACT

Contaminants are removed from a surface of a substrate by applying a fluid to the surface; lowering the temperature of the fluid to form a solid layer of the fluid and entrap contaminants therein; and applying energy to the layer and/or substrate to cause the layer containing the contaminants to separate from the surface.

32 Claims, No Drawings

METHOD OF CLEANING CONTAMINANTS FROM THE SURFACE OF A SUBSTRATE

FIELD OF THE INVENTION

The present invention relates to removing contaminants from a surface of a substrate. The present invention is especially advantageous for cleaning semiconductor substrates, for example, silicon wafers after chemical processing. In particular, the present invention relates to applying a fluid to the surface to be cleaned, lowering the temperature of the fluid to form a solid layer of it and to entrap contaminants therein, and applying energy to separate the solid layer and the surface from each other.

BACKGROUND OF THE INVENTION

In the fabrication of semiconductor devices, semiconductor substrates such as silicon wafers are typically subjected to a number of wet processing steps. Following wet processing, it is critical to dry these wafers leaving them free of chemical and particulate impurities. Typically drying is accomplished by physical removal of water from the wafer surface in centrifugal dryers, by displacement of water with a miscible and evaporative solvent (e.g. isopropyl alcohol) or by modification of the surface tension gradient (Marangoni effect). However, both of these techniques suffer from the problems of removal or elimination of contaminants and drying stains.

Contamination is always a concern in wafer processing, drying stains have been shown to be a deposition of colloidal silica on the surface of the wafers. Therefore, drying stains, in fact, are little more than very, very small and low-level particle-based residual which needs to agglomerate in large numbers in well defined regions of the wafer in order to be 'seen' or observed with either automated inspection systems or optical microscopes.

Drying stains occur because: (1) the equilibrium between dissolved silicates and colloidal silica is a strong function of pH, and (2) the media used for drying cause the water being removed from the surface to turn acidic when in contact with the drying medium, leading to the conversion of soluble silicates into silica, which can be deposited back onto the wafer surface.

Silicon compounds are present in the water (1) as a result of previous wafer processing where the substrate material (silicon) has been dissolved, (2) as an incoming impurity in the deionized (DI) water used to process the wafers or (3) as a result of hydrolysis of the wafer surface by the reactions:

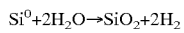
$Si^0 + 2H_2O \rightarrow SiO_2 + 2H_2$ or

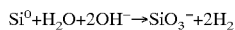
$Si^0 + H_2O + 2OH^- \rightarrow SiO_3^- + 2H_2$

In the presence of an acid, soluble silicates can be converted to insoluble silica by the reaction:

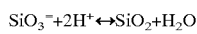
$SiO_3^- + 2H^+ \leftrightarrow SiO_2 + H_2O$

Centrifugal drying techniques are carried out in an atmospheric environment where a certain amount of $CO_2$ is present. In water $CO_2$ hydrolyses to carbonic acid. Other drying techniques use alcohols such as 2-propanol. Alcohols are also known to be weak acids, which can drive the precipitation of silicates on the wafer surface.

Accordingly, it would be desirable to provide an improved cleaning technique.

SUMMARY OF THE INVENTION

The present invention provides for an improved process for removing contaminants from a surface of a substrate. The process of the present invention makes it possible to clean and dry surfaces, including hydrophobic wafer surfaces, without forming watermarks, which reduce the yield.

More particularly, the present invention relates to a method of removing contaminants from the surface of a substrate. The method comprises applying a fluid to the surface to be cleaned; lowering the temperature of the fluid so as to form a solid layer of the fluid over the surface and to entrap contaminants within the layer; and applying energy such as sonic energy to the layer and/or the surface under such conditions as to result in separating the layer including the contaminants from the surface.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized the invention is capable of other and different embodiments, and its several details are capable of modifications in various obvious respects, without departing from the invention. Accordingly, the description is to be regarded as illustrative in nature and not as restrictive.

BEST AND VARIOUS MODES FOR CARRYING OUT INVENTION

The present invention relates to a method for removing contaminants from the surface of a substrate. By way of example, a preferred substrate cleaned according to the present invention is a silicon semiconductor substrate. The substrate includes contaminants that are soluble or suspendable in water (e.g. chemical residue) such as silica, silicates, silicon oxide, metals, metal oxides, organic carbon materials such as bacteria and bacterial membrane.

A fluid is typically applied to the substrate to be cleaned. The fluid is preferably deionized water. In the event, the fluid applied to the substrate also contains contaminants dissolved and/or suspended therein, the present invention prevents these contaminants from contaminating the substrate. The fluid is typically applied onto the surface as a spray or fluid stream or by immersing the substrate into a bath of the fluid. The fluid is typically applied to the substrate at ambient conditions of temperature and pressure of i.e. normal room temperature and pressure to form an intact and contiguous film.

The temperature of the fluid is lowered so as to form a solid layer of the fluid over the surface of the substrate and to entrap contaminants with the layer. This changes the physical state of the fluid to render it separable from the substrate. This lowering of the fluid temperature can be achieved by reducing the temperature of the substrate and/or of the fluid itself and preferably by reducing the temperature of the substrate. This is continued until the fluid freezes or solidifies thereby entrapping the contaminants. The temperature can be reduced by introducing a cryogenic gas in the solid or liquid phase. When reducing the temperature of the substrate itself, such is preferably lowered at a rate such that impurities can diffuse away from the substrate through the boundary layer of the solidifying or freezing material. For a typical range of cooling rates is about 250 W/cm² to about 5000 W/cm² of wafer surface area.

The solid layer with the entrapped contaminants is separated from the substrate by applying energy such as sonic energy to the solid layer and/or the substrate. The sonic energy can be applied as a bath process for multiple wafers simultaneously. In particular, a film could be frozen on the wafers by removing the wafers from a rinse tank followed by immersing the wafers in a liquid nitrogen bath or by spraying the wafers with a high volume/high velocity carbon dioxide. The edges of the wafers are then placed in direct physical contact with a sonic vibration bar to shake the wafers and remove the frozen fluid film.

In the alternative, the sonic energy can be applied to individual wafers by mounting the wafers on a chuck for processing ending in a fluid rinse. The wafer is then sprayed with a "freezing medium" such as $CO_2$ or $N_2$. The chuck and wafer are then vibrated with an integral sonic transducer thereby separating the frozen fluid from the wafer. In the alternative, the wafer side can be cooled to freeze the fluid and then heated slightly (e.g. not high enough for a long enough time to cause re-melting of the fluid) to dislodge the frozen bulk. The heat energy can be conduction, convection and/or radiant energy. The frozen fluid can be spun from the wafer by entraining chunks thereof in a carrier gas. In the alternative, the wafer can be oriented vertically causing removal of the frozen fluid.

The sonic energy employed typically has a frequency of at least about 5 Hertz and up to megasonic values. If desired, oscillation harmonic of the fluid/wafer can be applied. The time and power of the sonic energy can be carried commensurate with removal of the frozen film, which can be determined by persons skilled in the art without undue experimentation once aware of the present disclosure.

The above process makes it possible to clean and dry substrates without damaging surface materials or leaving residues or contaminants, especially watermarks.

Various modifications of the invention in addition to those shown and described herein will be apparent to those skilled in the art from the foregoing description. Such modifications are also intended to fall within the scope of the appended claims.

The foregoing disclosure includes all the information deemed essential to enable those skilled in the art to practice the claimed invention.

The foregoing description of the invention illustrates and describes the present invention. Additionally, the disclosure shows and describes only the preferred embodiments of the invention, but it is to be understood that the invention is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the invention and to enable others skilled in the art to utilize the invention as such, or other, embodiments and with the various modifications required by the particular applications or uses or the invention. Accordingly, the description is not intended to limit the invention to the form disclosed herein. Also, it is intended that the appended claims be construed to include alternative embodiments.

What is claimed is:

1. A method for removing contaminants from the surface of a semiconductor substrate comprising:
   forming an intact and contiguous film of a fluid on a surface of said semiconductor substrate at an ambient temperature;
   lowering the temperature of the fluid, thereby forming a solid layer of the fluid over the surface and entrapping contaminants within the layer; and
   applying energy consisting of sonic energy having a frequency of from about 5 Hz up to megasonic values to the layer or substrate or both under such conditions as to result in separation of said solid layer including the contaminants from the surface.

2. The method of claim 1 wherein the substrate is a silicon substrate.

3. The method of claim 1 wherein the contaminants comprise silicon, silicates, silicon dioxide, metals, metal oxides, organic materials, and bacteria.

4. The method of claim 1 wherein the fluid comprises water.

5. The method of claim 4 wherein the water is deionized water.

6. The method of claim 1 wherein the energy is applied to the layer.

7. The method of claim 1 wherein the energy is applied to the substrate.

8. The method of claim 1 wherein the fluid is applied at ambient conditions.

9. The method of claim 1 wherein the temperature of the fluid is lowered by directly reducing its temperature.

10. The method of claim 1 wherein the temperature of the fluid is lowered by employing a cryogenic gas in the solid or liquid state.

11. The method of claim 10 wherein said cryogenic gas comprises nitrogen.

12. The method of claim 10 wherein said cryogenic gas comprises carbon dioxide.

13. The method of claim 1 wherein the energy is sonic energy.

14. The method of claim 13 wherein the sonic energy is applied to the layer.

15. The method of claim 13 wherein the sonic energy is applied to the substrate.

16. The method of claim 1 wherein heat energy is applied.

17. The method of claim 16 wherein the heat energy is applied to the substrate.

18. The method of claim 1 wherein the temperature of the liquid is lowered by reducing the temperature of the substrate.

19. The method of claim 18 wherein the temperature of the fluid is lowered by employing a cyrogenic gas in the solid or liquid state.

20. The method of claim 19 wherein said cyrogenic gas comprises nitrogen.

21. The method of claim 19 wherein said cyrogenic gas comprises carbon dioxide.

22. A method for removing contaminants from the surface of a semiconductor substrate comprising:
   forming an intact and contiguous film of a fluid on a surface of said semiconductor substrate at an ambient temperature;
   lowering the temperature of the fluid by reducing the temperature of the substrate so as to form a solid layer of the fluid over the surface and entrapping contaminants within the layer; and
   applying energy consisting of sonic energy having a frequency of from about 5 Hz up to megasonic values to the layer or substrate or both under such conditions as to result in separation of said solid layer including the contaminants from the surface.

23. The method of claim 22 wherein the substrate is a silicon substrate.

24. The method of claim 22 wherein the contaminants comprise silicon, silicates, silicon dioxide, metals, metal oxides, organic materials, and bacteria.

25. The method of claim 22 wherein the fluid comprises water.

26. The method of claim 25 wherein the water is deionized water.

27. The method of claim 25 wherein the fluid is applied at ambient conditions.

28. The method of claim 22 wherein the sonic energy is applied to the layer.

29. The method of claim 22 wherein the sonic energy is applied to the substrate.

30. The method of claim 22 wherein the temperature of the fluid is lowered by employing a cyrogenic gas in the solid or liquid state.

31. The method of claim 30 wherein said cyrogenic gas comprises nitrogen.

32. The method of claim 30 wherein said cyrogenic gas comprises carbon dioxide.

* * * * *